United States Patent [19]
Milburn, Jr.

[11] 4,229,666
[45] Oct. 21, 1980

[54] AUDIO DETECTOR CIRCUIT

[75] Inventor: Zachariah H. Milburn, Jr., Amherst, N.Y.

[73] Assignee: GTE Products Corporation, Stamford, Conn.

[21] Appl. No.: 946,254

[22] Filed: Sep. 27, 1978

[51] Int. Cl.³ .............................................. H03K 3/29
[52] U.S. Cl. ..................................... 307/290; 328/58; 328/138; 307/231; 307/233 A
[58] Field of Search ............... 307/290, 232, 231, 233; 328/138, 58; 329/110, 126

[56] References Cited

U.S. PATENT DOCUMENTS

| | | | |
|---|---|---|---|
| 3,209,173 | 9/1965 | Rumble | 328/58 X |
| 3,260,864 | 7/1966 | Nourney | 328/58 X |
| 3,302,037 | 1/1967 | Neumann | 307/290 |
| 3,403,269 | 9/1968 | Thompson | 328/138 X |
| 3,571,626 | 3/1971 | Reif | 307/290 |
| 3,584,241 | 6/1971 | Nakamura | 307/290 |

Primary Examiner—Saxfield Chatmon, Jr.
Attorney, Agent, or Firm—John A. Odozynski

[57] ABSTRACT

A detector with independent TURNON and TURNOFF time constants. The TURNOFF time constant is connected between the output of an input transistor and the input of an output transistor. The TURNON time constant is coupled by a diode to the output of the output transistor and is connected to a Schmitt Trigger, ultimately driving an ON/OFF relay in a television receiver. Although the time constants are independently selectable, in a specific application of the invention the TURNON time constant may be chosen to be approximately twice the period of the detector input signal and about five times the TURNOFF time constant. Various configurations of series and parallel RC time constants are shown.

18 Claims, 3 Drawing Figures

A

B

C

AUDIO DETECTOR CIRCUIT

FIELD OF THE INVENTION

This invention relates to audio and ultrasonic detector circuitry and more particularly to detectors used in conjunction with remote operation of television receivers.

BACKGROUND OF THE INVENTION

Audio detector circuits in general, and those used with remote receivers in particular, are intended to provide an output indicative of the presence or absence of a signal, usually at a specific frequency, at the detector input. Because these circuits typically employ RC time constant networks in the detection process, they inherently exhibit delays between the time a signal appears at or is removed from the detector input and the time the detector output so indicates. These so-called TURNON and TURNOFF delays are not necessarily detrimental and may be taken advantage of to enhance the operation of the remote receiver. For example, the length of the TURNON delay may be adjusted to provide increased immunity from spurious signals at the detector input. That is, the longer the TURNON delay, the less likely it will be that momentary noise signals will cause the detector to develop an erroneous output. On the other hand, excessively long TURNON delays are obviously undesirable. Conversely, a relatively short TURNOFF delay may be desirable. Prior art remote receivers have either not recognized the appropriate duration of the TURNON and TURNOFF delay or, if having so recognized, have not been able to implement independent delays through the use of simple, cost-effective detector circuits.

OBJECTS OF THE INVENTION

It is an object of this invention to provide a novel detector circuit for remote receivers used in television sets.

It is a further object of this invention that the detector circuitry enhance the operation of the remote receiver as well as assure its noise immunity.

It is a further object of this invention that the detector circuitry be characterized by independent TURNON and TURNOFF time constants.

It is a further object of this invention that the TURNON and TURNOFF time constants have a desired relationship to each other as well as to the period of the detector input signal.

SUMMARY OF THE INVENTION

The above and other objects and advantages are achieved in one aspect of this invention in a detector circuit comprising a first device having an input coupled to a source of signals and an output coupled to the input of a second device. A TURNOFF time constant is connected to both the output of the first device and the input of the second device. A unidirectional conducting device is connected between the output of the second device and a TURNON time constant. A hysteresis-exhibiting pulse-shaper is connected to the junction of the unidirectional conducting device and the TURNON time constant. As a result, the TURNON time constant determines the delay between the time at which an input signal is applied to the input of the first device and the time at which the pulse-shaper changes state from, for example, a logic ZERO level to a logic ONE level. Conversely, the TURNOFF time constant determines the delay between the time at which the signal is removed from the input of the first device and the time at which the pulse-shaper changes state from, for example, A ONE to a ZERO.

DESCRIPTION OF THE PREFERRED EMBODIMENTS

For a better understanding of the present invention, together with other and further objects, advantages and capabilities thereof, reference is made to the following disclosure and appended claims in connection with the above description of some of the aspects of the invention.

Figure 1:
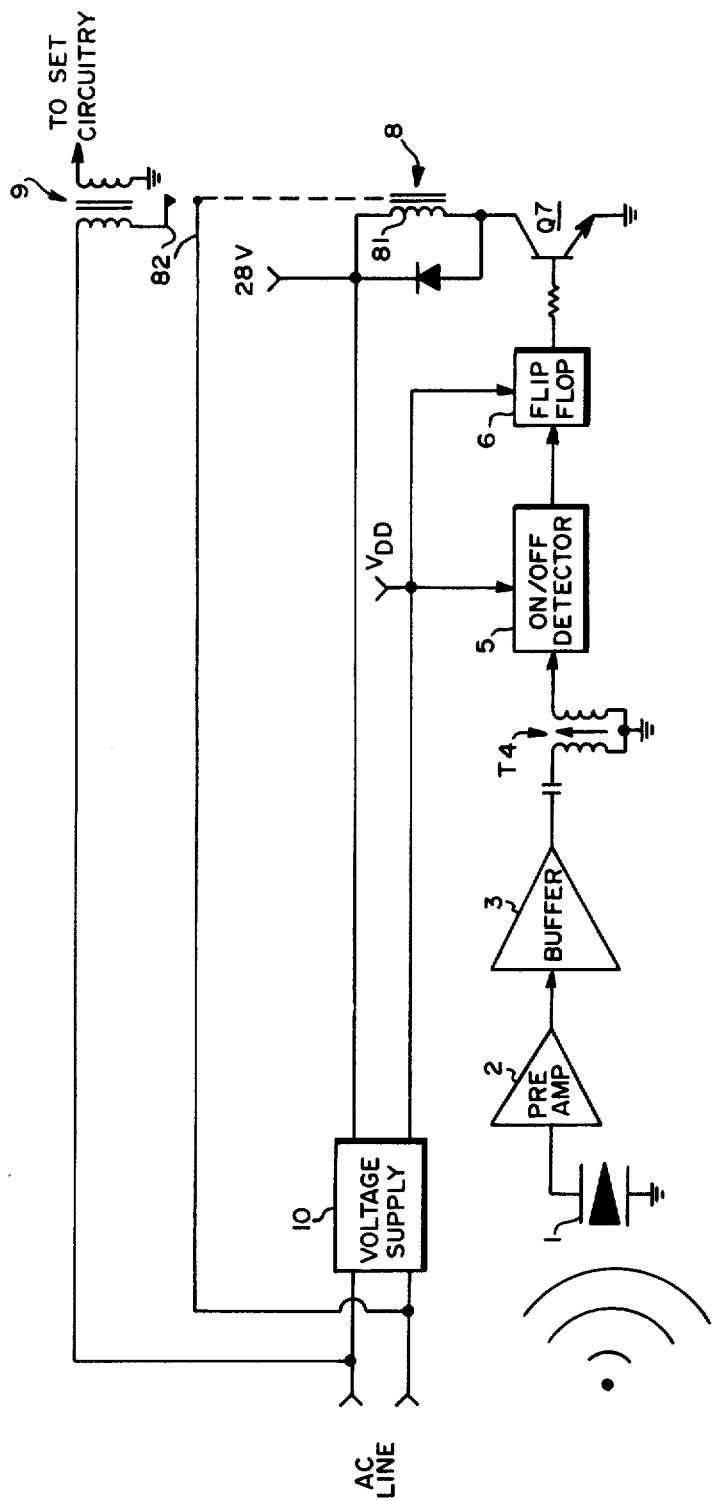
FIG. 1 is a diagram, substantially in block form, of a remote receiver system for implementing the ON/OFF function of a television set.

Referring now to FIG. 1, the remote receiver includes a transducer 1 which intercepts an acoustic signal transmitted by a remote transmitter (not shown). The acoustic signal is processed by a preamplifier 2 and coupled to the input of a buffer amplifier 3. In addition to effecting the desired amount of amplification of the acoustic signal, the preamplifier may also incorporate frequency-selective circuitry for rejecting signals outside the frequency range associated with the various remote functions. The buffer effects further amplification of the acoustic signal and presents a relatively high output impedance in order to maintain the selectivity established by a tuned transformer T4. Typically separate buffer amplifiers and tuned transformers may be provided for each remote function involved. The remote receiver circuitry depicted in FIG. 1 is associated with the ON/OFF function and T4 is accordingly tuned to a frequency corresponding to that function, for example 38.75 KHz. Other remote function referred to but not illustrated in FIG. 1, such as the VOLUME UP and VOLUME DOWN functions, will be implemented by identical buffer amplifiers and transformers tuned to, say, 37.25 KHz and 43.25 KHz respectively. The secondary of T4 is coupled to the input of the subject ON/OFF detector 5. In a manner to be precisely described below, the detector develops an output voltage at a logic level ZERO during the reception of a signal at 38.75 MHz; otherwise its output voltage is at a logic level ONE. The output of the detector 5 drives a flip-flop 6 which in turn drives a transistor Q7, ultimately activating or de-activating an ON/OFF relay 8, comprising a coil 81 and contacts 82.

Each time the output of the detector goes from ONE to ZERO, the flip-flop changes state; that is, its output voltage goes from its existing logic level to its complement. For example, assume that television receiver is initially off. The output of the flip-flop will be at a logic level ZERO and there will be no base drive to Q7. The relay contacts will be in their normal, open, condition. Upon reception of a signal at 38.75 MHz the output of the detector will go from ONE to ZERO and the output of the flip-flop will likewise change state from ZERO to ONE, thereby providing base current through a resistor to Q7. The collector current of Q7 will activate relay 8 and consequently close the contacts 81, thereby connecting the primary of the television receivers input power transformer 9 across the AC line. The voltage induced in the secondary of the transformer will be used to energize the television receiver circuitry so as to render it operational. Note that the remote receiver requires only momentary reception of the 38.75 MHz signal so that when that signal dissipates and the detector returns to the ONE state the flip-flop will reamin at a logic level ONE and the relay will remain activated. Subsequent reception of a signal at 38.75 MHz will again cause the detector output to go from a logic ONE level to a logic ZERO level and the flip-flop to change state, that is, assume a logic level ZERO. Q7 will become nonconducting and the relay will be de-activated, thereby de-energizing the television receiver. Because the voltage supply for the remote receiver, $V_{DD}$, and the 28-volt coil voltage are derived from an independent voltage supply 10, the ON/OFF function is continuously available, regardless as to whether the television receiver is on or off.

Figure 2:
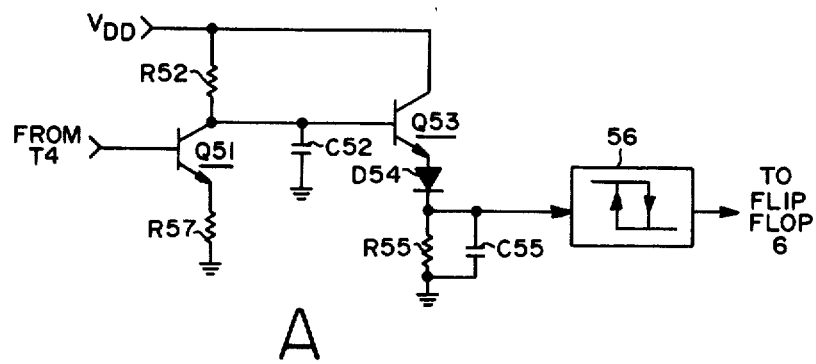
FIG. 2 presents schematic diagrams of three embodiments of the subject detector.
Figure 2:
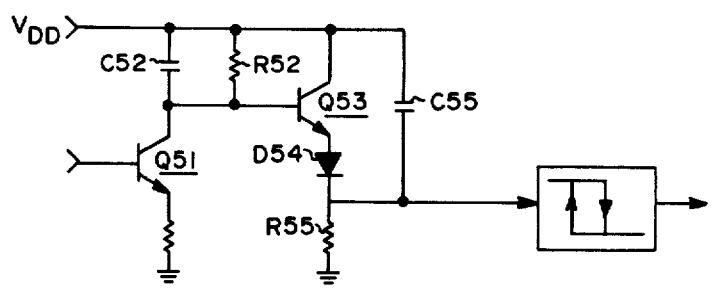
Figure 2:
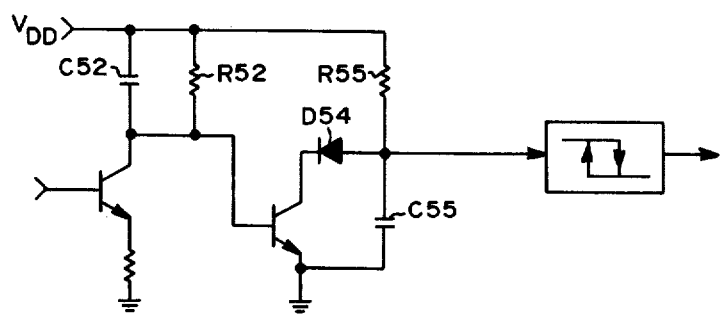

FIGS. 2A, 2B and 2C illustrate alternate detailed embodiments of the subject detector used in conjunction with the remote receiver described above. In each embodiment, the detector comprises first switching means, in the form of a transistor Q51, having an input (base) coupled to the secondary T4. The output (collector) of Q51 is coupled to a TURNOFF time constant 52 comprising a resistor R52 and a capacitor C52. The collector of Q51 and the TURNOFF time-constant are coupled to the input (base) of second switching means in the form of a transistor Q53. The output of Q53 (emitter in FIGS. 2A and 2B), collector in FIG. 2C is coupled through a unidirectional conducting device in the form of a diode D54 to a TURNON time constant comprising a resistor R55 and a capacitor C55. The output of the detector, at the junction of D54 and the TURNON time constant, is coupled through a pulse-shaping device 56 to the flip-flop 6. Device 56 may be any one of the type belonging to the generic class of switching devices characterized by a desired amount of hysteresis, for example, a Schmitt Trigger.

With particular reference now to FIG. 2A, operation of the detector is as follows. In the absence of a signal at the base of Q51, Q51 will be nonconducting. R52, connected between $V_{DD}$, a first reference potential, and the base of Q53, will provide current to Q53 so that Q53 will be conducting. C52, connected between the base of Q53 and ground, will be charged through R52 to the voltage at the base of Q53. The emitter current of Q53 will flow through D54, charging C55 to a logic ONE level so that the output of the Schmitt Trigger and the input to the flip-flop is a logic ONE level. When a signal at 38.75 MHz is received, each positive half-cycle of that signal will forward bias the base-emitter junction of Q51 so that it becomes saturated and the voltage at the base of Q53 will be determined by the values of R52 and the emitter resistor of Q51, R57. For practical purposes this voltage is equal to ground potential. C52 is rapidly discharged by the collector current of Q51 and thereafter operates to smooth the voltage waveform at the base of Q53, thereby effecting a capacitive-filtered half-wave detector characteristic. As indicated above, R52 and R57 are chosen so that when an input signal appears at the base of Q51, the voltage at the base of Q53 falls toward zero volts and the base emitter junction of Q53 is reverse biased. C55 will be discharged through the parallel-connected R55 and the voltage across it will decay according to a time constant equal to (R55×C55). When the voltage at the input to the Schmitt Trigger reaches its ONE-to-ZERO switching voltage, $V_{10}$, its output will switch to a logic ZERO level thereby triggering the flip-flop. When the input signal to Q51 is removed, Q51 will again be nonconducting. The voltage at the base of Q53 rises according to a TURNOFF time constant equal to (R52×C52). Because C55 is charged through D54 by the emitter current of Q53, the voltage across C55 and the input to the Schmitt Trigger will closely follow the base voltage of Q53. When the input to the Schmitt Trigger reaches its ZERO-to-ONE switching voltage, $V_{01}$, its output will return to a logic ONE level. Because the flip-flop changes state only on an input transition from a logic ONE level to a logic ZERO level, the flip-flop will retain its output. However, the next time an input signal appears at the base of Q51, the process described above will be repeated and the ONE-to-ZERO transition at the input of the flip-flop will cause it to change state, thereby energizing or de-energizing the television receiver accordingly.

Figure 3:
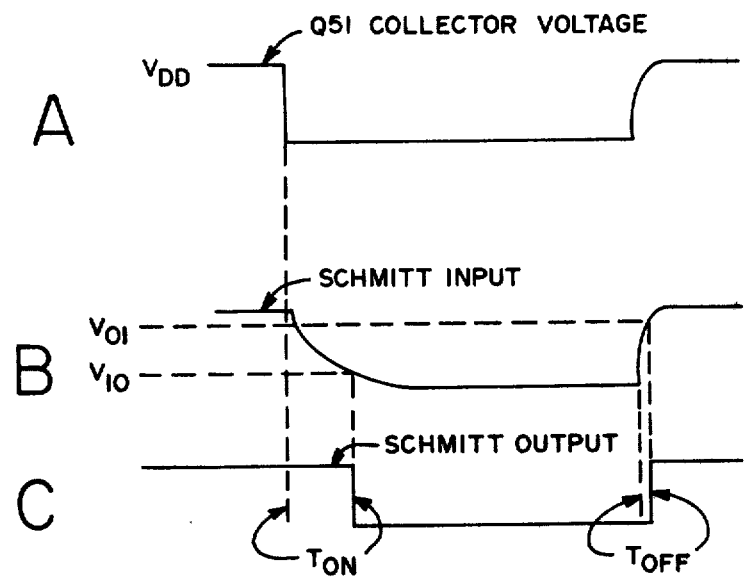
FIG. 3 is a timing diagram illustrating the relationships among relevant switching functions inherent to the subject detector.

The timing diagram of FIG. 3 summarizes the operation decribed above. Assuming that the television receiver is initially energized (see FIG. 3A), an input signal at the base of Q51 will cause its collector voltage to rapidly decrease from a value near $V_{DD}$ to approximately ground potential. As shown in FIG. 3B, the voltage at the input to the Schmitt Trigger will decay according to the TURNON time constant, eventually going below $V_{10}$. When this occurs, the Schmitt Trigger will change state, FIG. 3C, triggering the flip-flop and turning the television receiver off. FIG. 3C depicts a turn-on delay, $T_{on}$, from the time the input signal appears to the time the Schmitt Trigger changes state. When the input signal is removed, the collector voltage of Q51 and hence the input to the Schmitt Trigger, increases according to the TURNOFF time constant. For reasons to be discussed hereinafter, the TURNOFF time-constant is shorter than the TURNON time constant so that the delay between the time the input signal is removed and the time the Schmitt Trigger changes state (ZERO to ONE), $T_{off}$, is substantially shorter than $T_{on}$.

The operation of the detector circuit depicted in FIG. 2B, and, to a somewhat lesser extent, the circuit depicted in FIG. 2C, is in many respects similar to what has been described above, although there are salient structural differences in the circuitry used to effect the detection operation.

In FIG. 2B the TURNOFF time constant includes R52 and C52 parallel-connected between the base of Q53 and $V_{DD}$. The TURNON time constant has R55 connected between the cathode of D54 and ground; C55 is connected between the cathode of D54 and $V_{DD}$. When a signal is received at the base of Q51, Q53 and D54 again become reverse biased. C55 is charged, that is, the voltage across it increases, through R55 to ground and the Schmitt Trigger goes from a logic ONE level to a logic ZERO level when the voltage at its input goes below $V_{10}$. When the signal is removed C52 is discharged through R52. Because C55 will be discharged through D54 by the emitter current of Q53, the voltage at the input of the Schmitt Trigger will now again closely follow the voltage at the base of Q53.

The FIG. 2C, the TURNOFF time constant again has R52 and C52 parallel connected between the base of Q53 and $V_{DD}$. However, the output of Q53 is taken at its collector so that, when Q53 is conducting, current flows from the TURNON time-constant into Q53 through D54. The TURNON time-constant has R55 connected between $V_{DD}$ and the anode of D54; C55 is connected between the anode of D54 and ground. Again, when a signal is received at the base of Q51, Q53 becomes reverse biased and C55 is charged through R55 to $V_{DD}$. During this time C52 will be charged by Q51 so that the voltage on the collector of Q51 is approximately zero volts. When the signal is removed from the base of Q51, C52 will be discharged through R52 and the voltage at the base of Q53 will begin to increase. When this voltage reaches approximately 0.6 volts, Q53 will begin conducting and C55 will be rapidly discharged through D54 by the collector current of Q53. However, because C52 is discharged through R52 to a voltage source, $V_{DD}$, many times greater (typically 14 volts) than the voltage required to turn on Q53, the values of C52 and R52 need be several times greater than values used in the circuits shown in FIGS. 2A and 2B. For the circuits shown in FIGS. 2A and 2B, the voltage across C52 must change by an amount approximately equal to $V_{DD}$ in order for the detector to switch from the ON to the OFF state. However, with regard to FIG. C, the voltage across C52 need only change by approximately 1/23 of $V_{DD}$ for such switching to occur. Consequently, the product of R52 and C52 in FIG. C must be approximately 23 times the product of the corresponding values used in FIGS. 2A and 2B in order to effect a TURNOFF delay of substantially equal duration. Furthermore, with regard to FIG. 2C, D54 is functionally expendable to the extent that the base-to-collector junction of Q53, as is well known, can be considered functionally equivalent to a diode connected in the same direction as D54. The circuit of FIG. 2C will operate satisfactorily with the collector of Q53 directly connected to the TURNON time constant.

In each of the three specific embodiments described above it can be seen that the delay between the time a signal appears at the input of the detector and the time the detector will switch from a logic ONE level to a logic ZERO level is substantially determined by the TURNON time constant, R55 and C55. Conversely, the delay between the time the signal is removed from the input of the detector and its output switch from the logic ZERO level to a logic ONE level is substantially determined by the TURNOFF time constant, R52 and C52. For values of R55 and C55 equal to 68 K ohm and 4.7 µF respectively, the TURNON time constant is equal to approximately 320 milliseconds. For values of R52 and C52 equal to 51 K ohms and 1 µF respectively, the TURNOFF time constant is equal to approximately 51 milliseconds, that is, less than 1/5 the TURNON time constant. This is desirable in remote receivers because the TURNON time constant determines the delay between an operator's activation of the remote transmitter and the time the television receiver responds. In practice, the optimum length of the TURNON delay is a function of the specific environment and application in which the subject invention is used. TURNON delays of 50 milliseconds may be more than adequate in remote receivers for television sets. In any event, the longer TURNON delay provides increased insurance against erratic switching of the ON/OFF relay and increases the noise immunity of the receiver. The optimum relationship of the TURNOFF delay to the TURNON delay will similarly depend on the environment and application in which the detector is used. The 1 to 5 ratio for a television remote ON/OFF function was arrived at by subjective evaluation and is not held to be universally agreed upon. In fact, one of the significant features of this detector circuit is the independence of the TURNON and TURNOFF time constants. Because of this independence each may be established as desired, either in a television remote receiver or in a myriad of other possible applications, without regard for its effect on the other. In addition, it should be noted that the TURNOFF time constant, which, as described above, serves the further function of filtering the half-wave detected acoustic signal, is approximately twice the period of the 38.75 KHz acoustic signal so that a reasonably effective rectifier characteristic is achieved.

Accordingly, while there has been shown and described what are at present considered the preferred embodiments of the invention, it will be obvious to those skilled in the art that various changes and modifications may be made therein without departing from the scope of the invention as defined by the appended claims.

What is claimed is:

1. A detector circuit comprising: input means coupled to a source of input signals; first switching means having an input coupled to the input means;

A TURNOFF time constant coupled to the output of the first switching means, said TURNOFF time constant for determining the time delay between the removal of an input signal and the corresponding change in detector output;

second switching means having an input coupled to the output of the first switching means and to the TURNOFF time constant;

a TURNON time constant, said TURNON time constant for determining the time delay between the reception of an input signal and the corresponding change in the detector output; and a unidirectional conducting device having a first electrode coupled to the output of the second switching means and a second electrode coupled to the TURNON time constant whereby the TURNON time constant is effectively disconnected from the second switching means during the reception of an input signal and effectively connected during the removal of an input signal.

2. A detector circuit as defined in claim 1 wherein the TURNOFF time constant comprises a resistive branch coupled between the output of the first switching means and a first source of reference potential and a capacitive branch coupled between the output of the first switching device and a second source of reference potential.

3. A detector circuit as defined in claim 1 wherein the TURNOFF time constant comprises a resistive branch and a capacitive branch, each coupled between the output of the first switching means and a first source of reference potential.

4. A detector circuit as defined in claim 1 wherein the TURNON time constant comprises a capacitive branch coupled between the second electrode of the unidirectional conducting device and a first source of reference potential and a resistive branch coupled between the second electrode of the unidirectional conducting device and a second source of reference potential.

5. A detector circuit as defined in claim 1 wherein the TURNON time constant comprises a resistive branch and a capacitive branch, each coupled between the second electrode of the unidirectional conducting device and a second source of reference potential.

6. A detector circuit as defined in claim 2 wherein the TURNON time constant comprises a resistive and a capacitive branch, each coupled between the second electrode of the unidirectional conducting device and the second source of reference potential.

7. A detector circuit as defined in claim 3 wherein the TURNON time constant comprises a capacitive branch coupled between the second electrode of the unidirectional conducting device and the first source of reference potential and a resistive branch coupled between the second electrode of the unidirectional conducting device and a second source of reference potential.

8. A detector circuit as defined in claim 6 or claim 7 wherein the unidirectional conducting device is so arranged and constructed as to conduct current from the output of the second switching device into the TURNON time constant.

9. A detector circuit as defined in claim 3 wherein the TURNON time constant comprises a resistive branch coupled between the second electrode of the unidirectional conducting device and the first source of reference potential and a capacitive branch coupled between the second electrode of the unidirectional conducting device and a second source of reference potential.

10. A detector circuit as defined in claim 9 wherein the unidirectional conducting device is so arranged and constructed as to conduct current into the output of the second switching means from the TURNON time constant.

11. A detector circuit as defined in claim 1 wherein the TURNON time constant is at least five times the TURNOFF time constant.

12. A detector circuit as defined in claim 11 wherein the TURNOFF time constant is at least twice the period of the detector input signal.

13. A detector circuit comprising:
a first transistor having an input coupled to a source of input signals;
a second transistor having an input coupled to the output of the first transistor;
a TURNOFF time constant connected to both the output of the first transistor and to the input of the second transistor, said TURNOFF time constant for determining the time delay between the removal of an input signal and the corresponding change in the detector output;
a TURNON time constant for determining the time delay between the reception of an input signal and the corresponding change in the detector output;
a unidirectional conducting device connected between the output of the second transistor and the TURNON time constant said device for effectively disconnecting the second transistor from the TURNON time constant during the reception of an input signal and effectively connecting the second transistor from the TURNON time constant during the removal of an input signal; and
a hysteresis-exhibiting pulse-shaper connected to the junction of the unidirectional conducting device and TURNON time constant, whereby the TURNON time constant determines the delay between the time at which an input signal is applied to the input of the first transistor and the time at which the pulse-shaper changes state in a first sense and the TURNOFF time constant determines the delay between the time at which the input signal is removed from the input of the first transistor and the time at which the pulse-shaper changes state in a second sense.

14. A detector circuit as defined in claim 13 wherein the TURNOFF time constant comprises a resistor connected between a first potential voltage and the input of the second transistor and a capacitor connected to the resistor so that the first transistor is conducting during half-cycles of the input signal having one polarity and otherwise nonconducting and the second transistor is nonconducting during both half-cycles of the input signal but is conducting when the input signal is removed.

15. A detector circuit as defined in claim 14 wherein the TURNON time constant comprises a resistor connected between a second potential voltage and the unidirectional conducting device and a capacitor connected to the resistor.

16. A detector as defined in claim 15 wherein the capacitor of the TURNON time constant is also connected to the second potential voltage so that when the second transistor is conducting the capacitor is charged through the unidirectional conducting device and when the second transistor is nonconducting the capacitor is discharged through the resistor of the TURNON time constant.

17. A detector as defined in claim 15 wherein the capacitor of the TURNON time constant is connected also to the first potential voltage so that when the second transistor is conducting the capacitor is discharged through the unidirectional conducting device and when the second transistor is nonconducting the capacitor is charged through the resistor of the TURNON time constant.

18. A detector circuit as defined in claim 14 wherein the TURNON time constant comprises a resistor connected between the unidirectional conducting device and the first potential voltage and a capacitor connected between the unidirectional conducting device and a second potential voltage so that when the second transistor is conducting the capacitor is discharged through the unidirectional conducting device and when the second transistor is nonconducting the capacitor is charged through the resistor of the TURNON time constant.

* * * * *